(12) United States Patent
Kusuda

(10) Patent No.: US 8,542,066 B2
(45) Date of Patent: Sep. 24, 2013

(54) APPARATUS AND METHODS FOR REDUCING OUTPUT NOISE OF A SIGNAL CHANNEL

(75) Inventor: Yoshinori Kusuda, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 21 days.

(21) Appl. No.: 13/370,182

(22) Filed: Feb. 9, 2012

(65) Prior Publication Data
US 2013/0207727 A1  Aug. 15, 2013

(51) Int. Cl.
*H03F 3/08* (2006.01)
(52) U.S. Cl.
USPC ............................................... 330/308; 330/9
(58) Field of Classification Search
USPC .................. 330/9, 51, 296, 308; 250/214 A, 250/214 AG
See application file for complete search history.

(56) References Cited

U.S. PATENT DOCUMENTS

| | | | |
|---|---|---|---|
| 6,441,684 B1 | 8/2002 | Nakamura | |
| 7,002,408 B2 * | 2/2006 | Roos et al. | 330/9 |
| 7,053,806 B1 | 5/2006 | Rao et al. | |
| 7,268,338 B2 * | 9/2007 | Liu et al. | 330/308 |
| 7,489,191 B2 * | 2/2009 | Rao et al. | 330/51 |
| 7,652,243 B2 * | 1/2010 | Olsen et al. | 250/214 A |
| 2004/0090281 A1 | 5/2004 | Vilander | |
| 2008/0303598 A1 | 12/2008 | Rao | |
| 2010/0066436 A1 | 3/2010 | Lee | |
| 2010/0282946 A1 | 11/2010 | Yin et al. | |

OTHER PUBLICATIONS

International Search Report and Written Opinion of the International Searching Authority in counterpart International Appl. No. PCT/US2013/024352, dated Jul. 22, 2013, in 10 pages.
Hwang et al., Controllable Readout Circuit for Indium Gallium Arsenide Photodiode Array Applications:, IET Circuits, Devices, and Systems, vol. 3, No. 3, Jun. 11, 2009, pp. 125-134.

* cited by examiner

*Primary Examiner* — Khanh V Nguyen
(74) *Attorney, Agent, or Firm* — Knobbe Martens Olson & Bear LLP

(57) ABSTRACT

Apparatus and methods for reducing output noise of a signal channel are provided. In one embodiment, a signal channel includes an amplifier for amplifying an input signal to generate an amplified signal. The amplifier includes a bias circuit that controls a bias current of the amplifier based on a voltage across a biasing capacitor. The apparatus further includes a sampling circuit for sampling the amplified signal. The sampling circuit generates an output signal based on a difference between a first sample of the amplified signal taken at a first time instance and a second sample of the amplified signal taken at a second time instance. The bias circuit samples a bias voltage onto the biasing capacitor before the first time instance and holds the voltage across the biasing capacitor substantially constant between the first time instance and the second time instance to reduce noise of the output signal.

21 Claims, 6 Drawing Sheets

APPARATUS AND METHODS FOR REDUCING OUTPUT NOISE OF A SIGNAL CHANNEL

BACKGROUND

1. Field

Embodiments of the invention relate to electronic devices, and more particularly, to electronic systems including signal channels.

2. Description of the Related Technology

Certain electronic systems can include one or more signal channels for processing signals. For example, an imaging system can include an integrated circuit (IC) having signal channels for processing signals received from image sensors. The signal channels can have an error that can arise from a variety of sources, such as output noise associated with the signal channels.

Signal channel output noise can degrade the integrity of data processed using the signal channels. For example, in an imaging system implementation, output noise of the signal channels can lead to pattern errors that can cause visible artifacts in images generated using the imaging system. In certain applications, reducing output noise by using differential signaling and/or by increasing circuit area or power consumption may not be a practical solution.

There is a need for improved signal processing in electronic systems including signal channels. Furthermore, there is a need for reducing output noise in ICs used for signal processing.

SUMMARY

In one embodiment, an apparatus includes an amplifier configured to amplify an input signal to generate an amplified signal and a sampling circuit configured to sample the amplified signal generated by the amplifier. The amplifier includes a bias circuit including a biasing capacitor, and the bias circuit is configured to control a magnitude of a bias current of the amplifier based at least partly on a voltage across the biasing capacitor. The sampling circuit is configured to generate an output signal based on a difference between a first sample of the amplified signal taken at a first time instance and a second sample of the amplified signal taken at a second time instance after the first time instance. The bias circuit is configured to sample a bias voltage onto the biasing capacitor before the first time instance and to hold the voltage across the biasing capacitor substantially constant between the first time instance and the second time instance.

In another embodiment, a method of reducing output noise of a signal channel is provided. The method includes biasing an amplifier with a bias current, controlling a magnitude of the bias current based at least partly on a voltage across a biasing capacitor, sampling a bias voltage onto the biasing capacitor and holding the voltage across the biasing capacitor substantially constant between a first time instance and a second time instance, amplifying an input signal to generate an amplified signal using the amplifier, sampling the amplified signal at the first time instance to generate a first sample, sampling the amplified signal at the second time instance to generate a second sample, and generating an output signal based on a difference between the first sample and the second sample.

In another embodiment, an apparatus includes an amplifier configured to amplify an input signal to generate an amplified signal and a means for sampling the amplified signal generated by the amplifier. The amplifier includes a means for biasing including a biasing capacitor, and the biasing means is configured to control a magnitude of a bias current of the amplifier based at least partly on a voltage across the biasing capacitor. The sampling means is configured to generate an output signal based on a difference between a first sample of the amplified signal taken at a first time instance and a second sample of the amplified signal taken at a second time instance after the first time instance. The biasing means is configured to sample a bias voltage onto the biasing capacitor before the first time instance and to hold the voltage across the biasing capacitor substantially constant between the first time instance and the second time instance.

DETAILED DESCRIPTION OF EMBODIMENTS

Figure 1:
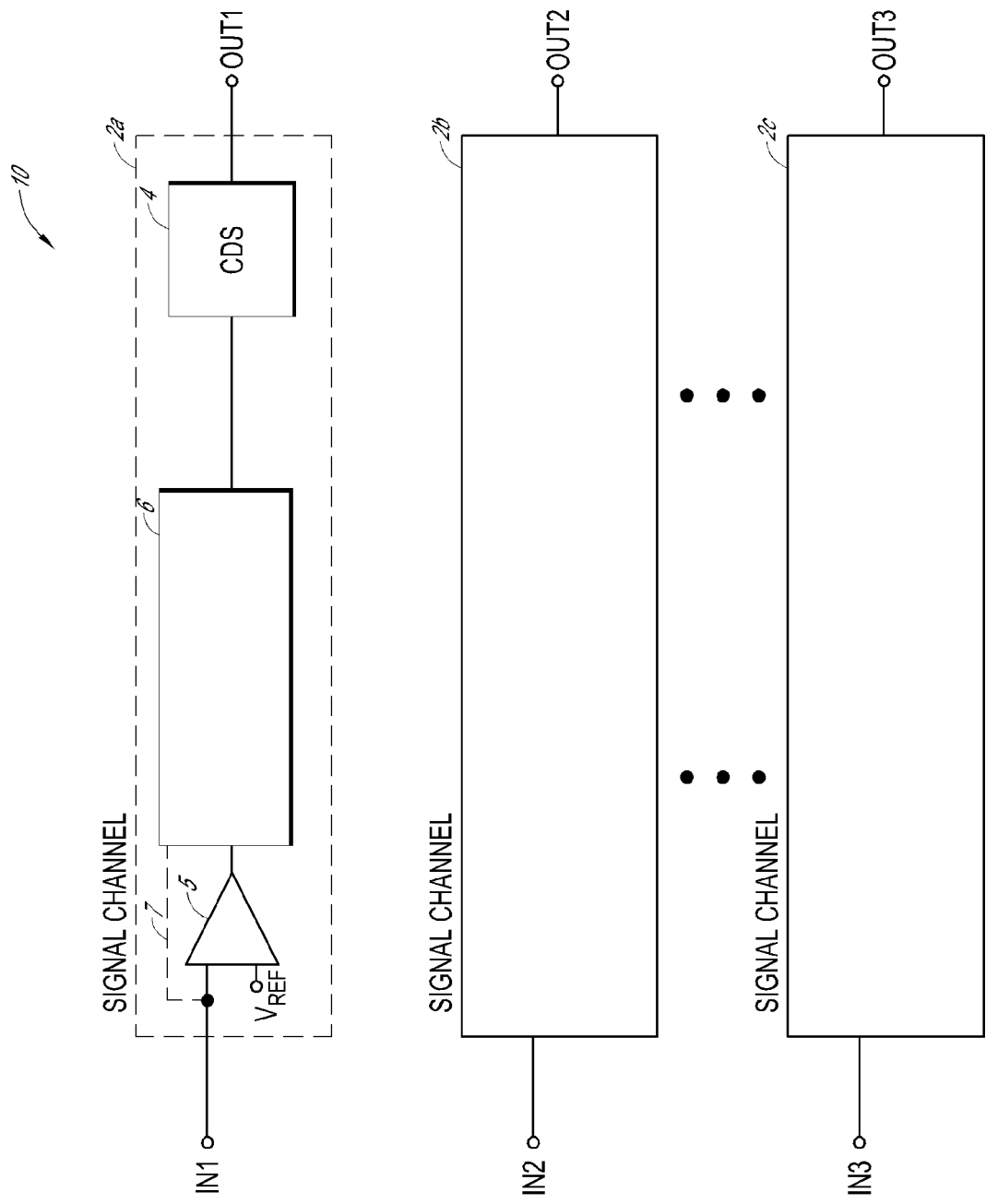
FIG. 1 is a schematic block diagram of one example of an electronic system.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Electronic Systems Including Low Noise Signal Channels

Electronic systems including a signal channel for processing an input signal to generate an output signal are provided. In certain implementations, the signal channel includes an amplifier and a correlated double sampling (CDS) circuit configured to double sample the output of the amplifier to generate the output signal. For example, the CDS circuit can be used to sample the amplifier's output at a first time instance and at a second time instance, and the difference between the samples can be used to generate the output signal. By using a CDS circuit to sample the output of the amplifier, the output noise of the signal channel can be reduced by removing error components that are common to both samples. In certain embodiments, a bias circuit generates a bias current of the amplifier based on a voltage across a biasing capacitor. The bias circuit samples a bias signal onto the biasing capacitor and holds the voltage across the biasing capacitor substantially constant between the first time instance and the second time instance. By generating the bias current of the amplifier in this manner, signal channel output noise can be reduced by preventing noise of the bias signal from changing the amplifier's bias current when the CDS circuit is double sampling the amplifier's output.

FIG. 1 is a schematic block diagram of one example of an electronic system 10. The electronic system 10 includes a first signal channel 2a, a second signal channel 2b, and a third signal channel 2c. The first signal channel 2a includes a CDS circuit 4, an amplifier 5, and channel circuitry 6. Although not illustrated in FIG. 1 for clarity, the second and third signal channels 2b, 2c can be configured to include substantially identical circuitry as the first signal channel 2a.

The first signal channel 2a can receive a first input signal IN1 and can process the first input signal IN1 to generate a first output signal OUT1. Additionally, the second signal channel 2b can receive a second input signal IN2 and can process the second input signal IN2 to generate a second output signal OUT2. Furthermore, the third signal channel 2c can receive a third input signal IN3 and can process the third input signal IN3 to generate a third output signal OUT3. Although the electronic system 10 is illustrated as including three signal channels 2a-2c, the electronic system 10 can be adapted to include more or fewer signal channels so as to process a desired number of electrical signals. For example, the electronic system 10 can include one signal channel, two signal channels, three signal channels, or four or more signal channels. The electronic system 10 can be any suitable electronic system, including, for example, an imaging system.

In the illustrated configuration, the amplifier 5 includes a first input configured to receive the first input signal IN1, a second input configured to receive a reference voltage $V_{REF}$, and an output electrically connected to a first end of the channel circuitry 6. The channel circuitry 6 further includes a second end electrically connected to an input of the CDS circuit 4. The CDS circuit 4 further includes an output configured to generate the first output signal OUT1. In certain implementations, the channel circuitry 6 can include one or more feedback paths from the output of the amplifier 5 to the first and/or second inputs of the amplifier 5. For example, a feedback path 7 can be provided between the output of the amplifier 5 and the first input of the amplifier 5 through all or part of the channel circuitry 6. Although not illustrated in FIG. 1 for clarity, the second and third signal channels 2b, 2c can each include an amplifier, CDS circuit, and channel circuitry electrically connected in a similar configuration.

As illustrated in FIG. 1, the first to third signal channels 2a-2c can be single-ended channels, which can have associated output noise. For instance, the first signal channel 2a can be disposed on an integrated circuit, and power supply noise, reference supply noise, and/or biasing noise can be injected into the first signal channel 2a and cause fluctuations in the first output signal OUT1 over time. The output noise can degrade the quality of signals generated using the electronic system 10. For example, in an imaging system, output noise can cause pattern errors that may generate artifacts in a resulting image.

The first to third input signals IN1-IN3 and the first to third output signals OUT1-OUT3 can be any suitable electrical signals, including, for example, voltage signals and/or current signals. In certain implementations, the first to third input signals IN1-IN3 can be a different type of electrical signal than the first to third output signals OUT1-OUT3. For instance, the first to third input signals IN1-IN3 can be current signals, and the first to third output signals OUT1-OUT3 can be voltage signals, or vice versa.

The first to third signal channels 2a-2c can include amplifiers for amplifying the first to third input signals IN1-IN3, respectively. For example, the first signal channel 2a can include the amplifier 5, which can be used to amplify the first input signal IN1 to a level suitable for processing using the channel circuitry 6. The channel circuitry 6 can also include feedback circuitry that can be used in conjunction with the amplifier 5 to process the first input signal IN1. For example, the channel circuitry 6 can include feedback circuitry for configuring the amplifier 5 to operate as an integrator. Thus, in certain implementations, the amplifier 5 and the channel circuitry 6 can be used to integrate and/or otherwise process the first input signal IN1.

The first to third output signals OUT1-OUT3 can each include a signal component and an error component. For example, noise sources and/or systematic offset of the first signal channel 2a can introduce error in the first output signal OUT1. The CDS circuit 4 can be used to reduce output noise of the first signal channel 2a. For example, the CDS circuit 4 can be configured to sample an amplified signal generated by the amplifier 5 at a first time instance $t_1$ and a second time instance $t_2$, and to take the difference between the samples to generate the first output signal OUT1. The CDS circuit 4 can reduce the common-mode error of the electronic system 10 by removing sources of common-mode error. For example, a source of common-mode error that is present in both the first sample and the second sample can be removed when the CDS circuit 4 computes a difference between the first and second samples. As persons having ordinary skill in the art will appreciate, the CDS circuit 4 can be used to sample the amplified signal generated by the amplifier directly or through one or more components of the channel circuitry 6.

Figure 2:
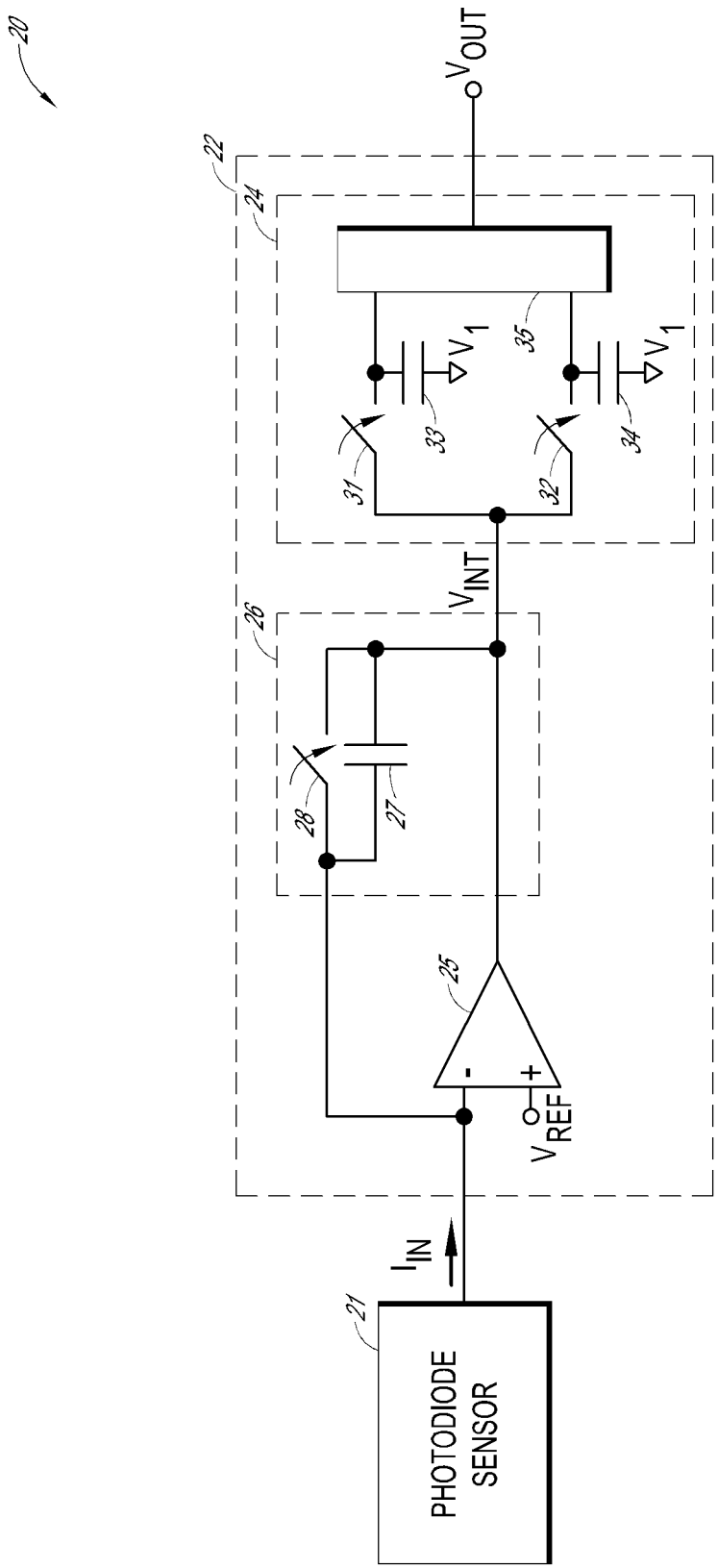
FIG. 2 is a schematic block diagram of another example of an electronic system.

FIG. 2 is a schematic block diagram of another example of an electronic system 20. The electronic system 20 includes a photodiode sensor 21 and a signal channel 22. The signal channel 22 includes a CDS circuit 24, an amplifier 25, and channel circuitry 26. The CDS circuit 24 includes a first sampling switch 31, a second sampling switch 32, a first sampling capacitor 33, a second sampling capacitor 34, and a subtractor 35. The channel circuitry 26 includes a feedback capacitor 27 and a feedback switch 28.

The amplifier 25 includes a non-inverting input electrically connected to the voltage reference $V_{REF}$ and an inverting input electrically connected to the photodiode sensor 21, to a first end of the feedback capacitor 27, and to a first end of the feedback switch 28. The amplifier 25 further includes an output electrically connected to a second end of the feedback capacitor 27, to a second end of the feedback switch 28, to a first end of the first sampling switch 31, and to a first end of the second sampling switch 32 at a node configured to generate an integrated voltage $V_{INT}$. The first sampling switch 31 further includes a second end electrically connected to a first end of the first sampling capacitor 33 and to a first input of the subtractor 35, and the second sampling switch 32 further includes a second end electrically connected to a first end of the second sampling capacitor 34 and to a second input of the subtractor 35. The first and second sampling capacitors 33, 34 each further include a second end electrically connected to a first voltage supply $V_1$, which can be, for example, a ground supply or node. The subtractor 35 further includes an output configured to generate an output voltage $V_{OUT}$.

The electronic system 20 can be used to integrate a photocurrent $I_{IN}$ from the photodiode sensor 21. For example, when the feedback switch 28 is in an opened or high impedance state, the photocurrent $I_{IN}$ can flow into or out of the feedback capacitor 27, and the integrated voltage $V_{INT}$ can be equal to about the product of the time integral of the photocurrent $I_{IN}$ and the inverse of the capacitance of the feedback capacitor 27. The feedback switch 28 can be transitioned to a closed or low impedance state to reset the integrator.

The feedback capacitor 27 can have any suitable capacitance, such as a capacitance selected to be in the range of about 0.1 pF to about 10 pF. However, skilled artisans will readily determine other applicable capacitance values.

The CDS circuit 4 can be used to sample the integrated voltage $V_{INT}$ generated by the output of the amplifier 25. For example, the first sampling switch 31 can be closed at a first time instance $t_1$ to sample the integrated voltage $V_{INT}$ across the first sampling capacitor 33, and the second sampling switch 32 can be closed at a second time instance $t_2$ to sample the integrated voltage $V_{INT}$ across the second sampling capacitor 34. The subtractor 35 can be used to take a difference between the voltage across the first sampling capacitor 33 and the voltage across the second sampling capacitor 34 to generate the output voltage $V_{OUT}$. In one embodiment, the CDS circuit 4 is configured to double sample the integrated voltage $V_{INT}$ over a sampling window that is in the range of about 1 µs to about 100 µs. However, skilled artisans will readily appreciate that sampling windows of other durations can be used. As used herein, the sampling window of the CDS circuit 4 can refer to a difference between the second time instance $t_2$ and the first time instance $t_1$, or $t_2-t_1$.

Double sampling the integrated voltage $V_{INT}$ can reduce common-mode error of the electronic system 20 by subtracting out or removing error components that are common to the voltage across the first sampling capacitor 33 and the voltage across the second sampling capacitor 34. Although the CDS circuit 4 illustrates one example of a sampling circuit that can be used in the signal channels described herein, other configurations of sampling circuits can be used.

The amplifier 25 can contribute error to the electronic system 20. For example, noise associated with a bias current of the amplifier 25 can contribute to the output noise of the signal channel 22. Although the correlated double sampling operation of the CDS circuit 24 can reduce or remove errors that are present in both the sample taken using the first sampling capacitor 33 and the sample taken using the second sampling capacitor 34, a difference in the amplifier's bias current between samples can result in the samples having different error components, as will be described in detail further below. Accordingly, the correlated double sampling operation of the CDS circuit 24 may not be sufficient to remove output noise associated with bias current noise of the amplifier 25.

The error contribution of the amplifier 25 can be exacerbated in implementations in which the amplifier is electrically connected in an asymmetric configuration. For example, as shown in FIG. 2, the channel circuitry 26 can include a feedback path between an input and an output of the amplifier 25, and the feedback path can permit noise to couple into the integrated voltage $V_{INT}$. Since the feedback path may be present between only one of the inputs and the output, the integrated voltage $V_{INT}$ can have an error component associated with the amplifier's bias current noise, even when the amplifier 25 operates differentially.

Although one example of a signal channel 22 is illustrated in FIG. 2, the noise reduction schemes described herein can be used in combination with other types of signal channels, including, for example, signal channels that include different configurations of channel and/or sampling circuitry, or in configurations in which the amplifier 25 is connected in other ways.

Figure 3:
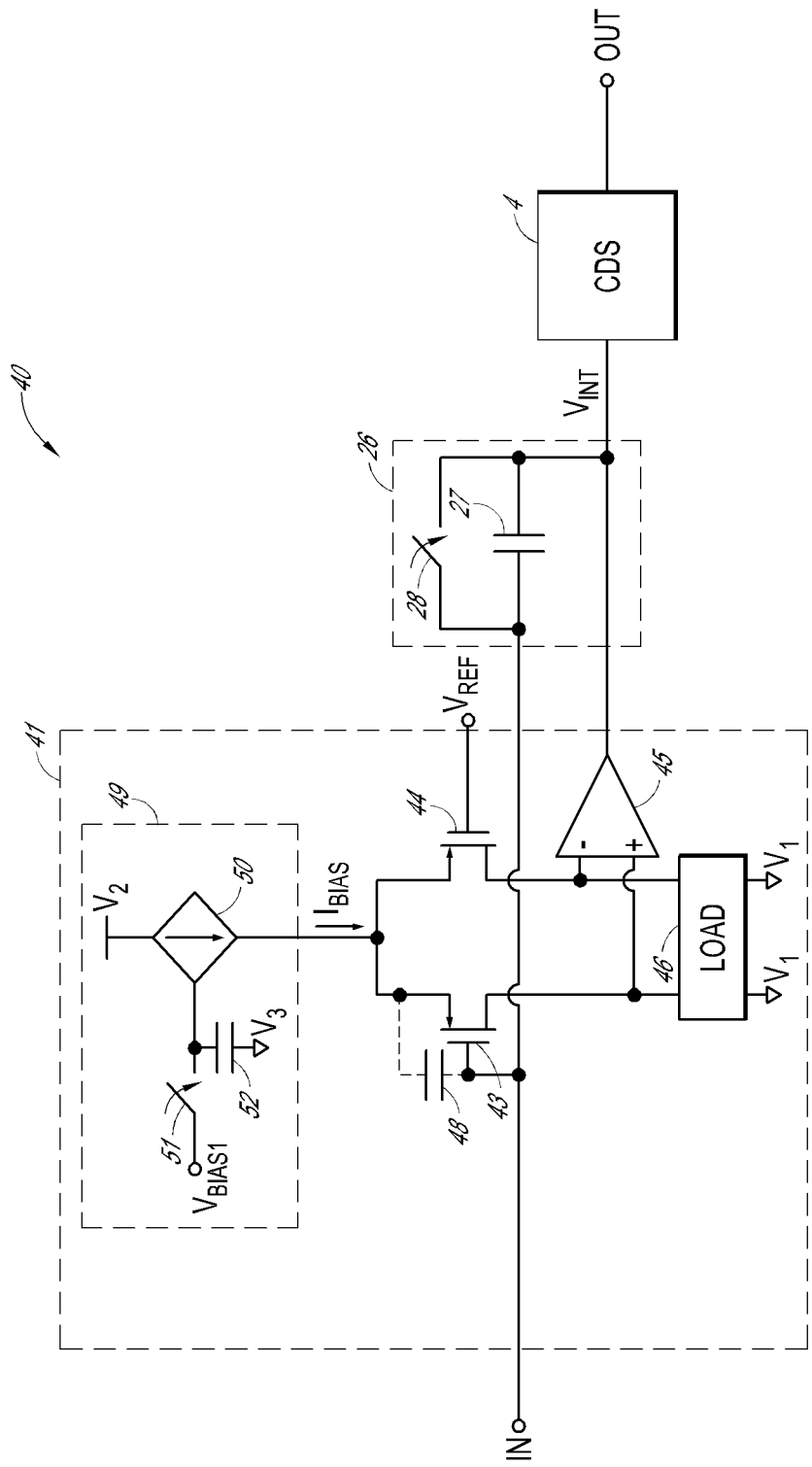
FIG. 3 is a schematic block diagram of one embodiment of a signal channel.

FIG. 3 is a schematic block diagram of one embodiment of a signal channel 40. The signal channel 40 includes the CDS circuit 4, the channel circuitry 26, and an amplifier 41.

The amplifier 41 includes a first input configured to receive the input signal IN, a second input configured to receive the reference voltage $V_{REF}$, and an output electrically connected to the CDS circuit 4 and to the channel circuitry 26. The output of the amplifier 41 is configured to generate the integrated voltage $V_{INT}$. The channel circuitry 26 includes the feedback capacitor 27 and the feedback switch 28 electrically connected in parallel between the first input of the amplifier 41 and the output of the amplifier 41. Additional details of the CDS circuit 4 and the channel circuitry 26 can be as described earlier.

The amplifier 41 includes a first p-type metal oxide semiconductor (PMOS) input transistor 43, a second PMOS input transistor 44, a buffer stage 45, a load block 46, and a bias circuit 49. The bias circuit 49 includes a voltage-controlled current source 50, a biasing switch 51, and a biasing capacitor 52. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The first PMOS input transistor 43 includes a gate electrically connected to the input signal IN and a drain electrically connected to a non-inverting input of the buffer stage 45 and to a first terminal of the load block 46. The second PMOS input transistor 44 includes a gate electrically connected to the reference voltage $V_{REF}$ and a drain electrically connected to an inverting input of the buffer stage 45 and to a second terminal of the load block 46. The first PMOS input transistor 43 further includes a source electrically connected to a source of the second PMOS input transistor 44 and to an output terminal of the voltage-controlled current source 50.

The voltage-controlled current source 50 further includes an input terminal electrically connected to a second voltage supply $V_2$, which can be, for example, a positive power supply. The voltage-controlled current source 50 further includes a control terminal electrically connected to a first end of the biasing switch 51 and to a first end of the biasing capacitor 52. The biasing switch 51 further includes a second end electrically connected to a first bias voltage $V_{BIAS1}$. The biasing capacitor 52 further includes a second end electrically connected to a third voltage supply $V_3$, which can be any suitable voltage, such as a low-noise power or ground supply. Although FIG. 3 illustrates one possible configuration of the biasing capacitor 52, the biasing capacitor 52 can be connected in other ways. For example, in certain implementations, the second end of the biasing capacitor 52 is electrically connected to the first voltage supply $V_1$ or to the second voltage supply $V_2$.

The buffer stage 45 can be included in the amplifier 41, and can be used to improve the operation of the amplifier 41. For example, the buffer stage 45 can be used to increase the overall gain of the amplifier 41, to combine a differential input signal to generate a singled-ended output signal, and/or to boost the output impedance of the amplifier 41. Although FIG. 3 illustrates a configuration including the buffer stage 45, in certain implementations the buffer stage 45 can be omitted.

The load block 46 can be any suitable load, including, for example, active and/or passive loads. In certain implementations, the load block 46 includes one or more resistive elements configured to convert a difference in the drain currents of the first and second PMOS input transistors 43, 44 into a differential voltage suitable for driving the inputs of the buffer stage 45.

As shown in FIG. 3, the voltage-controlled current source 50 is configured to generate a bias current $I_{BIAS}$ for biasing the first and second PMOS input transistors 43, 44. For example, the output terminal of the voltage-controlled current source 50 can generate a bias current $I_{BIAS}$ that has a magnitude based upon a voltage level of the control terminal. Since the control terminal of the voltage-controlled current source 50 is electrically coupled to the biasing capacitor 52, the voltage across the biasing capacitor 52 can be used to control the magnitude of the bias current $I_{BIAS}$.

Noise associated with the bias current $I_{BIAS}$ of the amplifier 41 can contribute to the output noise of the signal channel 40. For example, fluctuations in the bias current $L_{BIAS}$ can cause the voltages at the sources of the first and second PMOS input transistors 43, 44 to change. The first and second PMOS input transistors 43, 44 are electrically connected in a differential configuration which can reduce or eliminate certain common-mode noise sources from reaching the output of the amplifier 41. However, when the amplifier 41 is connected asymmetrically within the signal channel 40, such as when one of the inputs of the amplifier 41 is connected to the output of the amplifier 41 through a feedback path, noise of the bias current $I_{BIAS}$ can impact the output noise of the signal channel 40. For example, the first PMOS input transistor 43 can have a parasitic gate-source capacitance 48, and noise associated with the bias current $I_{BIAS}$ can couple through the parasitic gate-source capacitance 48 and the feedback capacitor 27 and reach the input of the CDS circuit 4. Although the CDS circuit 4 can sample the integrated voltage $V_{INT}$ at the first instance $t_1$ and at the second time instance $t_2$ to remove errors that are present in both samples, the magnitude of the bias current $I_{BIAS}$ may change between the first and second time instances $t_1$, $t_2$ due to noise.

The bias circuit 49 can be used to reduce noise associated with the bias current $I_{BIAS}$ of the amplifier 41. For example, the biasing switch 51 can be configured to sample the first bias voltage $V_{BIAS1}$ onto the biasing capacitor 52 such that the voltage of the control terminal of the voltage-controlled current source 50 is held substantially constant between the first time instance $t_1$ and the second time instance $t_2$ over which the CDS circuit 4 double samples the output of the amplifier 41.

Although the biasing capacitor 52 can have a sampling error associated with sampling the first bias voltage $V_{BIAS1}$ onto the biasing capacitor 52, the sampling error can be constant over the sampling window $(t_2-t_1)$ of the CDS circuit 4. Since the CDS circuit 4 can take a difference between the first and second samples to remove error that is common to the first and second samples, the CDS circuit 4 can also be used to remove sampling error associated with sampling the first bias voltage $V_{BIAS1}$ onto the biasing capacitor 52. Accordingly, a portion of the output noise of the signal channel 40 that is associated with generating the bias current $I_{BIAS}$ can be reduced or eliminated.

In certain implementations, the biasing switch 51 can be configured to transition from a closed state to an opened state at a time instance $t_0$ before the first sampling time instance $t_1$ so as to sample the first bias voltage $V_{BIAS1}$ onto the biasing capacitor 52. The biasing switch 51 can remain in the open state throughout the sampling window $(t_2-t_1)$ of the CDS circuit 4, thereby holding the first bias current $I_{BIAS}$ substantially constant during the double sampling operation of the CDS circuit 4. The biasing switch 51 can be configured to transaction back into the closed state at a time instance $t_3$ that is after the second sampling time instance $t_2$.

In one embodiment, the biasing switch 51 is controlled using a timing signal used to control the feedback switch 28. Accordingly, the biasing switch 51 can be closed when the feedback switch 28 is closed to reset integration, and the biasing switch 51 can be opened when the feedback switch 28 is opened to initiate integration. However, other timing configurations can be used.

The biasing switch 51 can be implemented in a variety of ways, including, for example, by using one or more transistors devices. For example, in certain implementations, the biasing switch 51 is implemented using a field-effect transistor (FET). However, other implementations are possible.

The biasing capacitor 52 can have any suitable capacitance, such as a capacitance selected to be in the range of about 1 pF to about 10 pF. However, persons having ordinary skill in the art will appreciate that the capacitance of the biasing capacitor 52 can depend on a variety of factors, such as the implementation of the voltage-controlled current source 50 and/or the type of the signal channel 40.

The voltage-controlled current source 50 can be implemented using any suitable current source. For example, the voltage-controlled current source 50 can be implemented using a FET, such as a MOS transistor and/or a junction field-effect transistor (JFET) in which a gate voltage of the FET is used to control a drain current of the FET. However, other configurations are possible, including, for example, bipolar transistor configurations. For example, a base-emitter voltage of a bipolar transistor can be used to control an emitter current of the transistor. In a bipolar transistor implementation of the voltage-controlled current source 50, the biasing capacitor 52 can be configured to have a relatively large capacitance such that a base current of the bipolar transistor does not substantially change the voltage across the biasing capacitor 52 during the sampling window $(t_2-t_1)$ of the CDS circuit 4.

Although FIG. 3 illustrates a noise reduction scheme in the context of a signal channel that is configured to integrate an input signal to generate an output signal, the teachings herein are applicable to signal channels that process an input signal in other ways. For example, the teachings herein are applicable to a variety of signal channels that include an amplifier for processing input signals, including for example, amplifiers configured to perform mathematical operations such as inversion, subtraction, multiplication, differentiation, and/or integration of one or more inputs signals.

Figure 4:
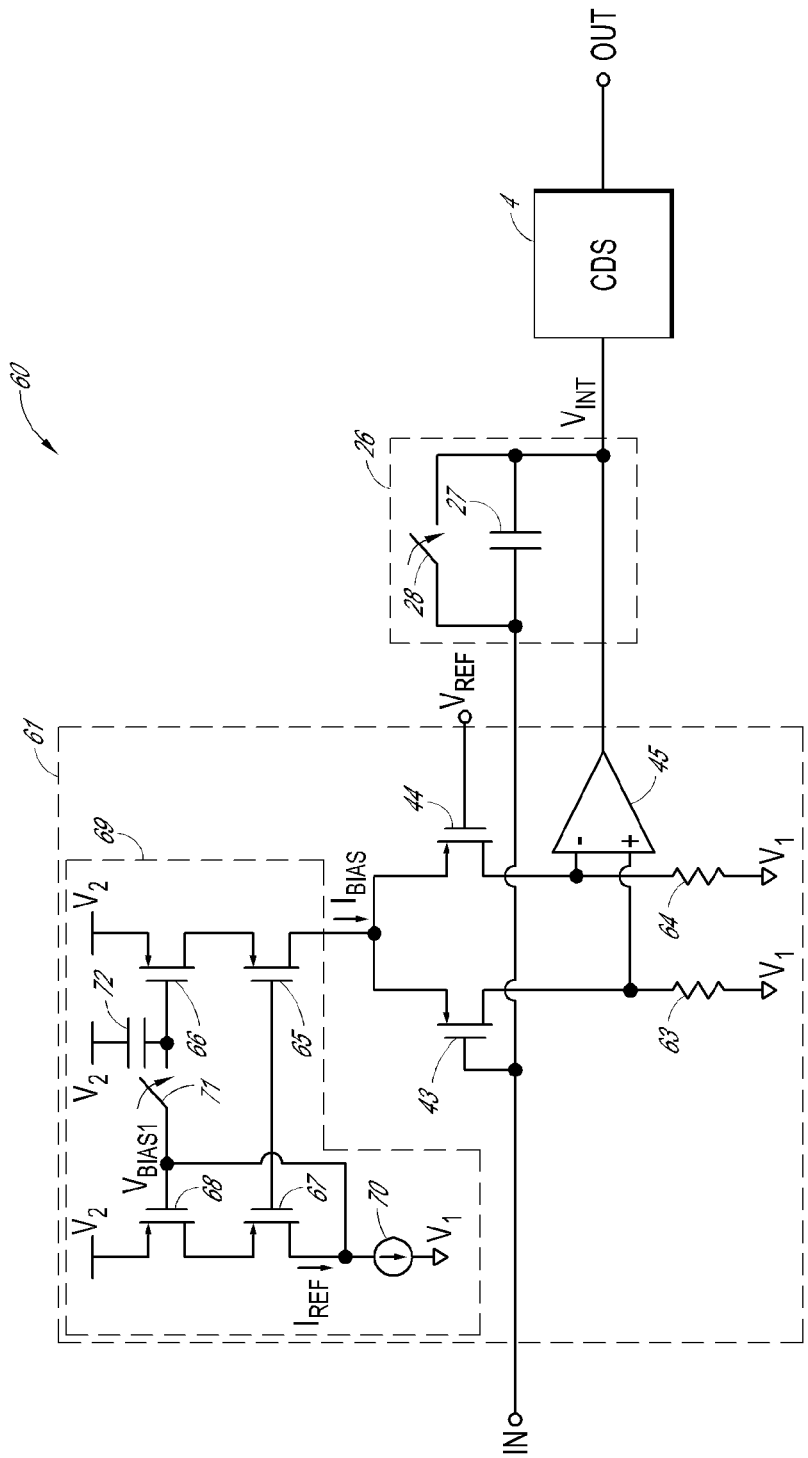
FIG. 4 is a schematic block diagram of another embodiment of a signal channel.

FIG. 4 is a schematic block diagram of another embodiment of a signal channel 60. The signal channel 60 includes the CDS circuit 4, the channel circuitry 26, and an amplifier 61.

The amplifier 61 includes a first input configured to receive the input signal IN, a second input configured to receive the reference voltage $V_{REF}$, and an output electrically connected to the CDS circuit 4 and to the channel circuitry 26. The output of the amplifier 61 is configured to generate the integrated voltage $V_{INT}$. The channel circuitry 26 includes the feedback capacitor 27 and the feedback switch 28 electrically connected in parallel between the first input of the amplifier 61 and the output of the amplifier 61. Additional details of the CDS circuit 4 and the channel circuitry 26 can be as described earlier.

The amplifier 61 includes the first PMOS input transistor 43, the second PMOS input transistor 44, the buffer stage 45, a first load resistor 63, a second load resistor 64, and a bias circuit 69. The bias circuit 69 includes first to fourth PMOS biasing transistors 65-68, a current source 70, a biasing switch 71, and a biasing capacitor 72.

The first load resistor 63 includes a first end electrically connected to a non-inverting input of the buffer stage 45 and to a drain of the first PMOS input transistor 43. The second load resistor 64 includes a first end electrically connected to an inverting input of the buffer stage 45 and to a drain of the second PMOS input transistor 44. The first and second load resistors 63, 64 each further include a second end electrically connected to the first voltage supply $V_1$.

The first and second load resistors 63, 64 can aid in converting a difference in the drain currents of the first and second PMOS input transistors 43, 44 into a differential voltage suitable for driving the non-inverting and inverting inputs of the buffer stage 45. In one embodiment, the first and second load resistors 63, 64 each have a resistance selected to be in the range of about 1 kΩ to about 100 kΩ. However, the resistance of the first and second load resistors 63, 64 can depend on a variety of factors, and other resistance values will be readily determined by one of skill in the art. For example, in one embodiment the resistance of the first and second load resistors 63, 64 is selected so that the voltage gain from the gate to the drain of the first and second PMOS input transistors 43, 44 is in the range of about 5 to about 50.

The first PMOS input transistor 43 further includes a gate electrically connected to the input signal IN. The second PMOS input transistor 44 further includes a gate electrically connected to the reference voltage $V_{REF}$. The second PMOS input transistor 44 further includes a source electrically connected to a source of the first PMOS input transistor 43 and to a drain of the first PMOS biasing transistor 65.

The first PMOS biasing transistor 65 further includes a source electrically connected to a drain of the second PMOS biasing transistor 66 and a gate electrically connected to a gate of the third PMOS biasing transistor 67. The second PMOS biasing transistor 66 further includes a source electrically connected to the second voltage supply $V_2$ and a gate electrically connected to a first end of the biasing switch 71 and to a first end of the biasing capacitor 72. The biasing capacitor 72 further includes a second end electrically connected to the second voltage supply $V_2$. The third PMOS biasing transistor 67 further includes a source electrically connected to a drain of the fourth PMOS biasing transistor 68 and a drain electrically connected to a first terminal of the current source 70, to a gate of the fourth PMOS biasing transistor 68, and to a second end of the biasing switch 71 at a node configured to generate the first bias voltage $V_{BIAS1}$. The fourth PMOS biasing transistor 68 further includes a source electrically connected to the second voltage supply $V_2$, and the current source 70 further includes a second terminal electrically connected to the first voltage supply $V_1$.

The bias circuit 69 is configured to generate a bias current $I_{BIAS}$ for biasing the first and second PMOS input transistors 43, 44. The magnitude of the bias current $I_{BIAS}$ can be controlled based on the voltage across the biasing capacitor 72. For example, the gate voltage of the second PMOS biasing transistor 66 can be controlled based on a voltage across the biasing capacitor 72. The biasing switch 71 can be used to sample the first bias voltage $V_{BIAS1}$ onto the biasing capacitor 72, thereby controlling the magnitude of the bias current $I_{BIAS}$. To reduce noise associated with bias current $I_{BIAS}$ from reaching the output of the signal channel 60, the biasing switch 71 can be configured to sample the first bias voltage $V_{BIAS1}$ onto the biasing capacitor 72 and to hold the bias current $I_{BIAS}$ substantially constant between the first time instance $t_1$ and the second time instance $t_2$ over which the CDS circuit 4 double samples the output of the amplifier 61.

The illustrated bias circuit 69 has been implemented in a cascode configuration in which the channel of the first PMOS biasing transistor 65 has been disposed in a signal path between the channel of the second PMOS biasing transistor 66 and the sources of the first and second PMOS input transistors 43, 44. Implementing the bias circuit 69 in a cascode configuration can boost the output impedance of the bias circuit 69 and help prevent noise of the second supply voltage $V_2$ from reaching the input of the CDS circuit 4.

The first to fourth PMOS biasing transistors 65-69 and the current source 70 can operate as a current mirror for mirroring a current $I_{REF}$ of the current source 70 to generate the bias current $I_{BIAS}$. To help reduce power consumption of the amplifier 61, the first and second PMOS biasing transistors 65, 66 can have a size greater than the third and fourth PMOS biasing transistors 67, 68, respectively, so as to amplify the reference current $I_{REF}$. For example, in one embodiment the bias circuit 69 is configured to amplify the reference current $I_{REF}$ by a factor ranging between about 8 and about 40 to generate the bias current $I_{BIAS}$. However, other configurations are possible.

Configuring the bias circuit 69 to operate as a current mirror with gain can reduce power consumption associated with generating the bias current $I_{BIAS}$. However, configuring the bias circuit 69 to provide amplification of the reference current $I_{REF}$ can also amplify noise of the reference current $I_{REF}$. For example, for a change of $\Delta I$ of the reference current $I_{REF}$ due to noise, the bias current $I_{BIAS}$ can change by $n*\Delta I$, where n is the gain of the current mirror.

To help reduce or eliminate noise of the reference current $I_{REF}$ from reaching the output of the signal channel 60, the biasing switch 71 can be configured to sample the first bias voltage $V_{BIAS1}$ onto the biasing capacitor 72 and to hold the voltage across the biasing capacitor 72 substantially constant over the sampling window $(t_2-t_1)$ of the CDS circuit 4.

Although the biasing capacitor 72 can have a sampling error associated with sampling the first bias voltage $V_{BIAS1}$ onto the biasing capacitor 72, the sampling error can be constant over the sampling window $(t_2-t_1)$ of the CDS circuit 4. Since the CDS circuit 4 can take a difference between the first and second samples to remove error that is common to the first and second samples, the CDS circuit 4 can be used to remove sampling error associated with sampling the first bias voltage $V_{BIAS1}$ onto the biasing capacitor 72. Accordingly, the output noise of the signal channel 60 can be relatively small, even in implementations in which the first bias voltage $V_{BIAS1}$ fluctuates by a relatively large amount over time from noise of the reference current $I_{REF}$. Thus, the biasing schemes described herein can be used to provide signal channels with low output noise and low power consumption.

Figure 5:
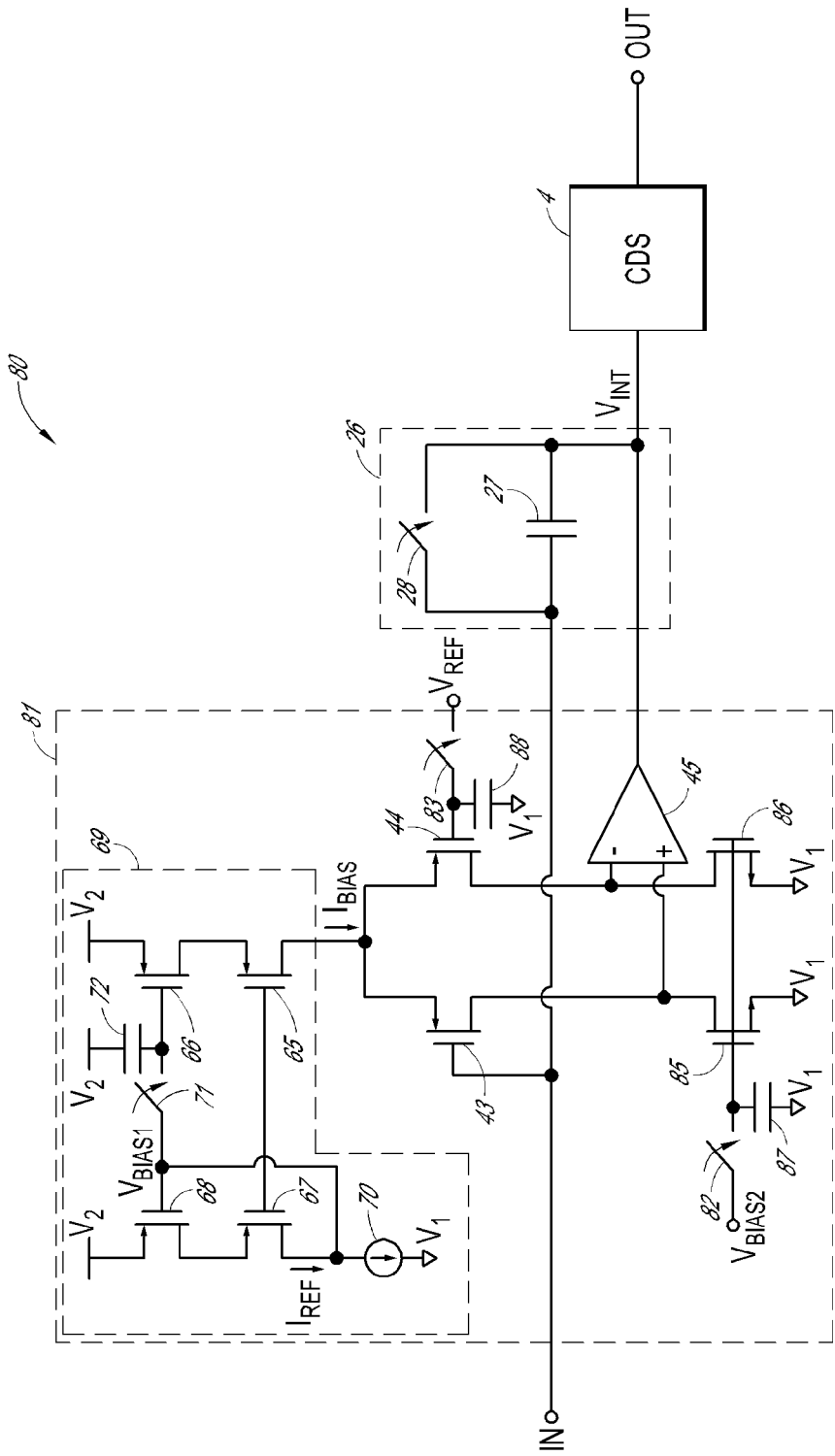
FIG. 5 is a schematic block diagram of yet another embodiment of a signal channel.

FIG. 5 is a schematic block diagram of yet another embodiment of a signal channel 80. The signal channel 80 includes the CDS circuit 4, the channel circuitry 26, and an amplifier 81.

The amplifier 81 includes a first input configured to receive the input signal IN, a second input configured to receive the reference voltage $V_{REF}$, and an output electrically connected to the CDS circuit 4 and to the channel circuitry 26. The output of the amplifier 81 is configured to generate the integrated voltage $V_{INT}$. The channel circuitry 26 includes the feedback capacitor 27 and the feedback switch 28 electrically connected in parallel between the first input of the amplifier 81 and the output of the amplifier 81. Additional details of the CDS circuit 4 and the channel circuitry 26 can be as described above.

The amplifier 81 includes the first PMOS input transistor 43, the second PMOS input transistor 44, the buffer stage 45, the bias circuit 69, a first switch 82, a second switch 83, a first n-type MOS load transistor 85, a second NMOS load transistor 86, a first capacitor 87, and a second capacitor 88.

The amplifier 81 of FIG. 5 can be similar to the amplifier 61 of FIG. 4, except that the first and second load resistors 63, 64 of the amplifier 61 have been replaced with the first and second NMOS load transistors 85, 86, and that the amplifier 81 of FIG. 5 has been adapted to further include the first and second switches 82, 83 and the first and second capacitors 87, 88.

The first NMOS load transistor 85 includes a source electrically connected to the first voltage supply $V_1$ and a drain electrically connected to a drain of the first PMOS input transistor 43 and to the non-inverting input of the output stage 45. The second NMOS load transistor 86 includes a source electrically connected to the first voltage supply $V_1$ and a drain electrically connected to a drain of the second PMOS input transistor 44 and to the inverting input of the output stage 45. The first NMOS load transistor 85 further includes a gate electrically connected to a gate of the second NMOS load transistor 86, to a first end of the first capacitor 87, and to a first end of the first switch 82. The first capacitor 87 further includes a second end electrically connected to the first voltage supply $V_1$, and the first switch 82 further includes a second end electrically connected to a second bias voltage $V_{BIAS2}$. The second switch 83 includes a first end electrically connected to the reference voltage $V_{REF}$ and a second end electrically connected to a first end of the second capacitor 88 and to the gate of the second PMOS input transistor 44. The second capacitor 88 further includes a second end electrically connected to the first voltage supply $V_1$.

As shown in FIG. 5, multiple bias and/or reference voltages can be sampled to reduce the impact of noise of the amplifier 81 on the output noise of the signal channel 80. For example, in addition to including the biasing switch 71 and the biasing capacitor 72 in the bias circuit 69 as described earlier with respect to FIG. 4, the amplifier 81 further includes the first and second switches 82, 83 and the first and second capacitors 87, 88, which can help reduce output noise of the signal channel 80. For instance, the first switch 82 can be configured to sample the second bias voltage $V_{BIAS2}$ onto the first capacitor 87 and to hold the voltage across the first capacitor 87 substantially constant over the sampling window $(t_2-t_1)$ of the CDS circuit 4 to help reduce or eliminate noise of the second bias voltage $V_{BIAS2}$ from reaching the output of the signal channel 80. Similarly, the second switch 83 can be configured to sample the reference voltage $V_{REF}$ onto the second capacitor 88 and to hold the voltage across the second capacitor 88 substantially constant over the sampling window $(t_2-t_1)$ of the CDS circuit 4. Accordingly, in certain implementations described herein, amplifiers are provided in which one or more bias and/or reference signals of the amplifier are sampled and held constant over the sampling window $(t_2-t_1)$ of the CDS circuit 4 to reduce output noise of a signal channel.

Figure 6:
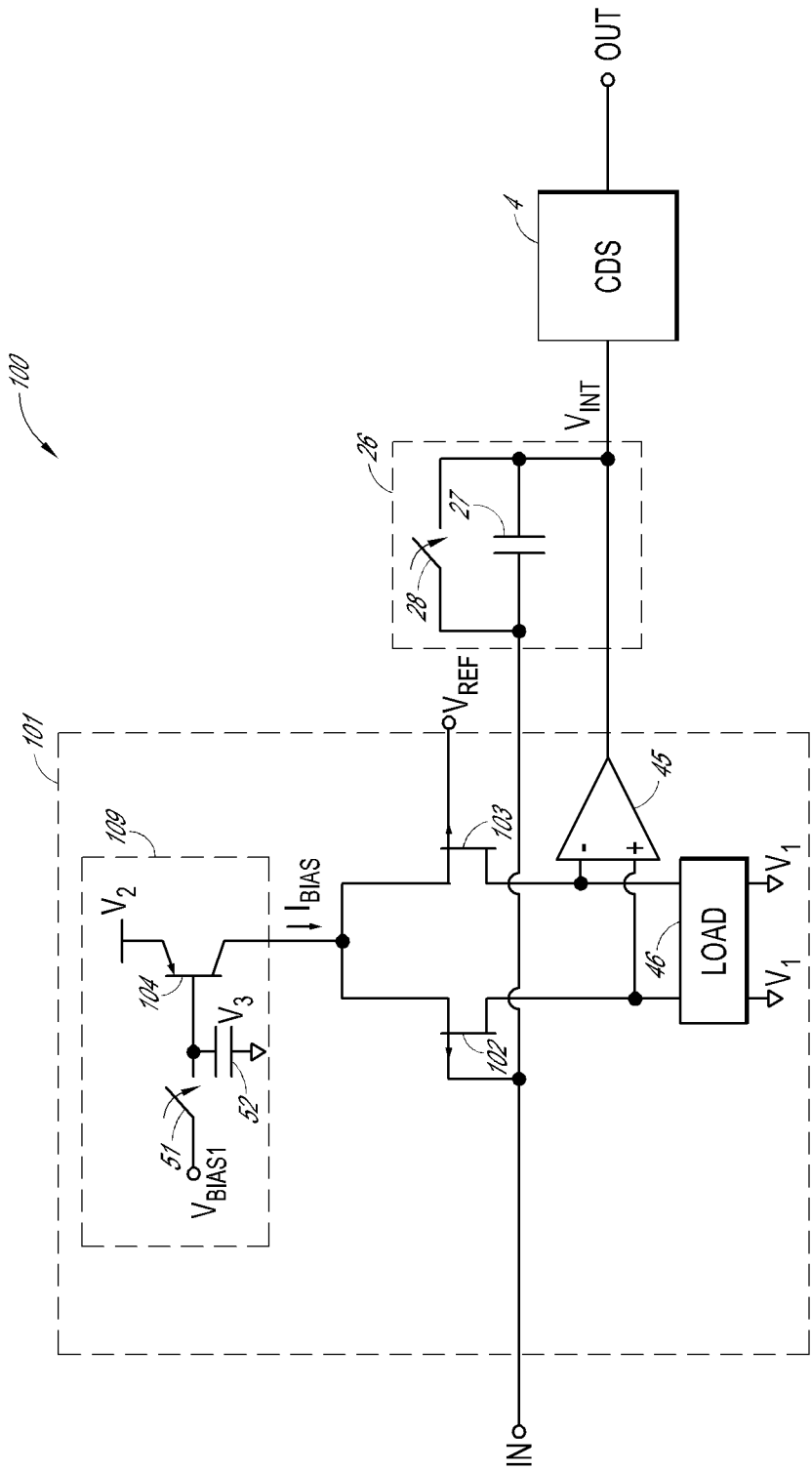
FIG. 6 is a schematic block diagram of yet another embodiment of a signal channel.

FIG. 6 is a schematic block diagram of yet another embodiment of a signal channel 100. The signal channel 100 includes the CDS circuit 4, the channel circuitry 26, and an amplifier 101.

The amplifier 101 includes a first input configured to receive the input signal IN, a second input configured to receive the reference voltage $V_{REF}$, and an output electrically connected to the CDS circuit 4 and to the channel circuitry 26. The output of the amplifier 101 is configured to generate the integrated voltage $V_{INT}$. The channel circuitry 26 includes the feedback capacitor 27 and the feedback switch 28 electrically connected in parallel between the first input of the amplifier 101 and the output of the amplifier 101. Additional details of the CDS circuit 4 and the channel circuitry 26 can be as described above.

The amplifier 101 includes the buffer stage 45, the load block 46, a first p-type JFET 102, a second p-type JFET 103, and a bias circuit 109. The bias circuit 109 includes the biasing switch 51, the biasing capacitor 52, and a PNP bipolar transistor 104.

The amplifier 101 of FIG. 6 is similar to the amplifier 41 of FIG. 3. However, in contrast to the amplifier 41 of FIG. 3 that uses first and second PMOS input transistors 43, 44 as a differential pair, the amplifier 101 of FIG. 6 uses the first and second p-type JFET transistors 102, 103 as a differential pair. As skilled artisans will appreciate, the teachings herein are applicable to a wide variety of amplifier configurations, including FET and bipolar transistors configurations. Furthermore, although the differential pairs shown in FIGS. 3-6 are illustrated as p-type, the teachings herein are applicable to amplifiers including an n-type differential pair.

The amplifier 101 of FIG. 6 is also different than the amplifier 41 of FIG. 3 in that the bias circuit 109 of FIG. 6 uses the bipolar transistor 104 as a voltage-controlled current source. In a bipolar transistor implementation of the voltage-controlled current source, the biasing capacitor 52 can be configured to have a relatively large capacitance such that a base current of the bipolar transistor does not substantially change the voltage across the biasing capacitor 52 during the sampling window $(t_2-t_1)$ of the CDS circuit 4. For example, the biasing capacitor 52 can be sized such the voltage across the biasing capacitor 52 changes by less than about 10 µV during the sampling window $(t_2-t_1)$ of the CDS circuit 4. However, skilled artisans will readily ascertain other voltage values.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, medical electronic products, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. The medical electronic products can include, but are not limited to, a Digital-X-ray detector, a CT (Computed Tomography) scanner, an Ultrasounds system, a MRI (Magnetic Resonance Imaging) system, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus, comprising:
an amplifier configured to amplify an input signal to generate an amplified signal, wherein the amplifier comprises a bias circuit including a biasing capacitor and a voltage-controlled current source for generating a bias current, wherein the bias circuit is configured to control a magnitude of the bias current of the amplifier based at least partly on a voltage across the biasing capacitor; and
a sampling circuit configured to sample the amplified signal generated by the amplifier, wherein the sampling circuit is configured to generate an output signal based on a difference between a first sample of the amplified signal taken at a first time instance and a second sample of the amplified signal taken at a second time instance after the first time instance,
wherein the bias circuit is configured to sample a bias voltage onto the biasing capacitor before the first time instance, and wherein the bias circuit is configured to hold the voltage across the biasing capacitor substantially constant between the first time instance and the second time instance.

2. The apparatus of claim 1, wherein the amplifier includes a first input configured to receive the input signal, a second input configured to receive a reference signal, and an output configured to generate the amplified signal.

3. The apparatus of claim 2, further comprising channel circuitry electrically connected to the output of the amplifier.

4. The apparatus of claim 3, wherein the channel circuitry includes a feedback capacitor electrically connected between the first input of the amplifier and the output of the amplifier, and wherein the amplifier is configured to use the feedback capacitor to integrate the input signal so that the amplified signal is about equal to an integral of the input signal.

5. The apparatus of claim 1, further comprising a photodiode sensor configured to generate the input signal.

6. The apparatus of claim 1, wherein the bias circuit includes a biasing switch electrically connected between the bias voltage and a first end of the biasing capacitor, and wherein the biasing switch is configured to transition from a closed state to an opened state before the first time instance so as to sample the bias voltage onto the biasing capacitor, and wherein the biasing switch is configured to transition from the opened state to the closed state after the second time instance.

7. The apparatus of claim 1, wherein the voltage-controlled current source includes a control terminal for controlling the magnitude of the bias current based on the voltage across the biasing capacitor.

8. The apparatus of claim 7, wherein the voltage-controlled current source is a first metal oxide semiconductor (MOS) biasing transistor, and a biasing switch is electrically connected between the bias voltage and a gate of the first MOS biasing transistor, and wherein the bias current is based on a drain current of the first MOS biasing transistor.

9. The apparatus of claim 8, further comprising a second MOS biasing transistor cascoded with the first MOS biasing transistor such that the drain current of the first MOS biasing transistor flows through a channel of the second MOS biasing transistor.

10. The apparatus of claim 1, wherein the amplifier includes a first MOS input transistor and a second MOS input transistor, and wherein the first and second MOS input transistors are configured to operate as a differential pair of the amplifier, and wherein a gate of the first MOS input transistor is configured to receive the input signal.

11. The apparatus of claim 10, further comprising a reference capacitor and a reference switch, wherein the reference switch includes a first end electrically connected to a reference voltage and a second end electrically connected to a gate of the second MOS input transistor and to the reference capacitor, and wherein the reference switch is configured to sample the reference voltage onto the reference capacitor before the first time instance, and wherein the reference switch is configured to hold the voltage across the reference capacitor substantially constant between the first time instance and the second time instance so as to reduce noise of the output signal.

12. The apparatus of claim 1, wherein the sampling circuit comprises a correlated double sampling (CDS) circuit comprising a first switch, a second switch, a first capacitor, a second capacitor, and a subtractor, wherein the first switch is configured to generate the first sample by sampling the amplified signal onto the first capacitor at the first time instance, and wherein the second switch is configured to generate the second sample by sampling the amplified signal onto the second capacitor at the second time instance, and wherein the subtractor is configured to generate the output signal based on the difference between the first and second samples.

13. A method of reducing output noise of a signal channel, the method comprising:
biasing an amplifier with a bias current generated from a voltage-controlled current source;
controlling a magnitude of the bias current based at least partly on a voltage across a biasing capacitor;
sampling a bias voltage onto the biasing capacitor and holding the voltage across the biasing capacitor substantially constant between a first time instance and a second time instance;
amplifying an input signal to generate an amplified signal using the amplifier;
sampling the amplified signal at the first time instance to generate a first sample;
sampling the amplified signal at the second time instance to generate a second sample; and
generating an output signal based on a difference between the first sample and the second sample.

14. The method of claim 13, wherein amplifying the input signal to generate the amplified signal comprises integrating the input signal.

15. The method of claim 13, further comprising generating the input signal using a photodiode sensor, wherein the input signal comprises a photocurrent.

16. The method of claim 13, wherein sampling the bias voltage onto the biasing capacitor and holding the voltage across the biasing capacitor substantially constant comprises switching a biasing switch from a closed state to an opened state before the first time instance and switching the biasing switch from the opened state to the closed state after the second time instance.

17. An apparatus, comprising:
an amplifier configured to amplify an input signal to generate an amplified signal, wherein the amplifier comprises a means for biasing including a biasing capacitor and a voltage-controlled current source for generating a bias current, wherein the biasing means is configured to control a magnitude of the bias current of the amplifier based at least partly on a voltage across the biasing capacitor; and
a means for sampling the amplified signal generated by the amplifier, wherein the sampling means is configured to generate an output signal based on a difference between a first sample of the amplified signal taken at a first time instance and a second sample of the amplified signal taken at a second time instance after the first time instance, wherein the biasing means is configured to sample a bias voltage onto the biasing capacitor before the first time instance, and wherein the biasing means is configured to hold the voltage across the biasing capacitor substantially constant between the first time instance and the second time instance.

18. The apparatus of claim 17, wherein the amplifier includes a first input configured to receive the input signal, a second input configured to receive a reference signal, and an output configured to generate the amplified signal, and wherein the amplifier further includes channel circuitry electrically connected to the output of the amplifier.

19. The apparatus of claim 18, wherein the channel circuitry includes a feedback capacitor electrically connected between the first input of the amplifier and the output of the amplifier, wherein the amplifier is configured to use the feedback capacitor to integrate the input signal so that the amplified signal is about equal to an integral of the input signal.

20. The apparatus of claim 17, wherein the biasing means includes a biasing switch electrically connected between the bias voltage and a first end of the biasing capacitor, and wherein the biasing switch is configured to transition from a closed state to an opened state before the first time instance so as to sample the bias voltage onto the biasing capacitor, and wherein the biasing switch is configured to transition from the opened state to the closed state after the second time instance.

21. The apparatus of claim 17, wherein the voltage-controlled current source includes a control terminal for controlling the magnitude of the bias current based on the voltage across the biasing capacitor.

* * * * *